United States Patent [19]
Jun et al.

[11] Patent Number: 6,165,555
[45] Date of Patent: Dec. 26, 2000

[54] METHOD FOR FORMING COPPER FILM USING CHEMICAL VAPOR DEPOSITION

[75] Inventors: Chi Hoon Jun; Youn Tae Kim; Jong Tae Baek, all of Daejeon, Rep. of Korea

[73] Assignee: Electronics and Telecommunications Research Institute, Daejeon, Rep. of Korea

[21] Appl. No.: 09/119,785

[22] Filed: Jul. 21, 1998

[30] Foreign Application Priority Data

Dec. 23, 1997 [KR] Rep. of Korea ................. 97-72835

[51] Int. Cl.[7] .................................................. C23C 16/18
[52] U.S. Cl. .................................. 427/252; 427/255.23
[58] Field of Search .......................... 427/252, 255.23; 438/681, 687

[56] References Cited

U.S. PATENT DOCUMENTS

| | | | |
|---|---|---|---|
| 4,948,623 | 8/1990 | Beach et al. | 427/35 |
| 5,087,485 | 2/1992 | Cho | 427/253 |
| 5,098,516 | 3/1992 | Norman et al. | 156/666 |
| 5,462,014 | 10/1995 | Awaya et al. | 118/725 |
| 5,744,192 | 4/1998 | Nguyen et al. | |

OTHER PUBLICATIONS

Choi et al., Appl. Phys. lett. vol. 68, No. 7, pp. 1017–1018, Feb. 1996.

Hochberg et al., Conference Proceedings, ULSI–X, Materials Research Society, pp. 79–86, 1995 (no month).

Shin et al., Mat. Res. Soc. Symp. Proc., vol. 427, pp. 219–223., 1996 (no month).

Low–Temperature Metal–Organic Chemical Vapor Deposition (LTMOCVD) of Device–Quality Copper Films for Microelectronic Applications; Alain E. Kaloyeros, Aiguo Feng; Jonathan Garhart; Kenneth C. Brooks; Sumanta K. Ghosh; Arjun N. Saxena and Fred Luehrs; vol. 19, No. 3 1990; pp. 271–276. (no month).

Film Growth Kintics of Chemical Vapor Deposition of Copper From $Cu(HFA)_2$; Do–Heyoung Kim; Robert H. Wentorf and William N. Gill; vol. 140, No. 11, Nov. 1993; pp. 3267–3272.

Growth and Resistivity Behavior of Copper Film by Chemical Vapor Deposition; E.S. Choi, S.K. Park and Hong H. Lee; vol. 143, No. 2, Feb. 1996; pp. 624–627.

Growth of Copper Films on Sputtered–TiN Surfaces by Metallorganic Chemical Vapour Deposition From $(hfac)Cu^{(1)}$ (VTMS); Ho–Young Yoen, Young–Bae Park and Shi–Woo Rhee; 1997; pp. 189–194. (no month).

*Primary Examiner*—Timothy Meeks
*Attorney, Agent, or Firm*—Antonelli, Terry, Stout & Kraus, LLP

[57] ABSTRACT

A chemical vapor deposition apparatus and a copper film formation method are disclosed. The chemical vapor deposition apparatus includes a process gas delivery unit including a first storing unit using a liquid deposition source, a delivery unit for transferring a liquid deposition source in the first storing unit to an evaporator, and an evaporator for vaporizing the liquid deposition source transferred from the delivery unit and supplying a process gas; and a reaction chamber for receiving the process gas from the process gas delivery unit and deposition a predetermined thin film on a wafer or substrate mounted therein.

4 Claims, 7 Drawing Sheets

(hfac) Cu (VTMOS) - Ar (hfac) Cu (VTMOS) -H (hfac) - Ar

165°C

175°C

200°C

250°C

300°C

FIG. 4A
(hfac) Cu (VTMOS) - Ar
FIG. 4B
(hfac) Cu (VTMOS) -H (hfac) - Ar
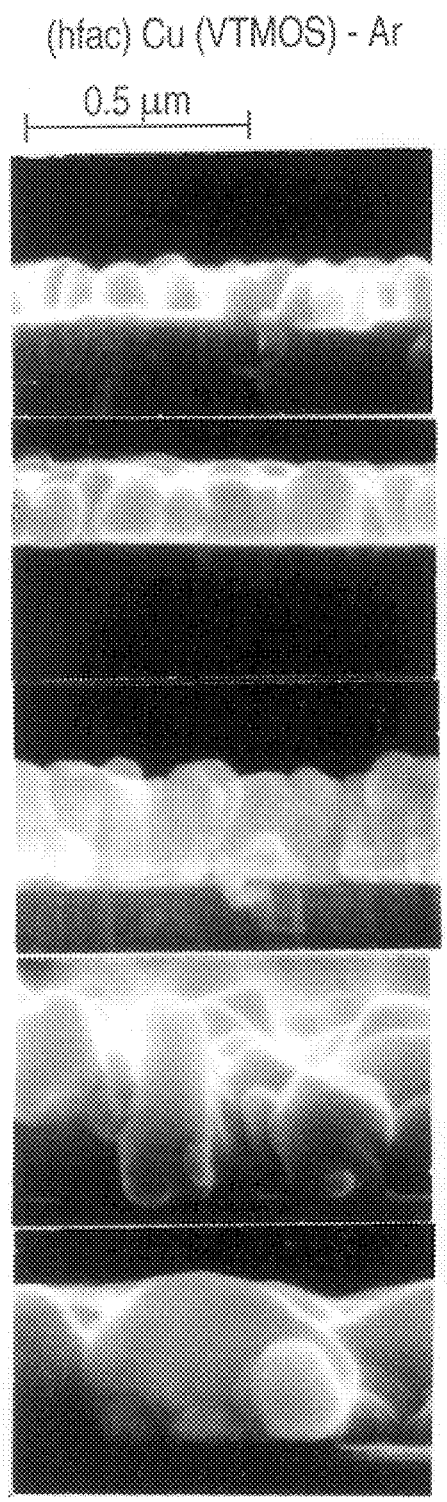
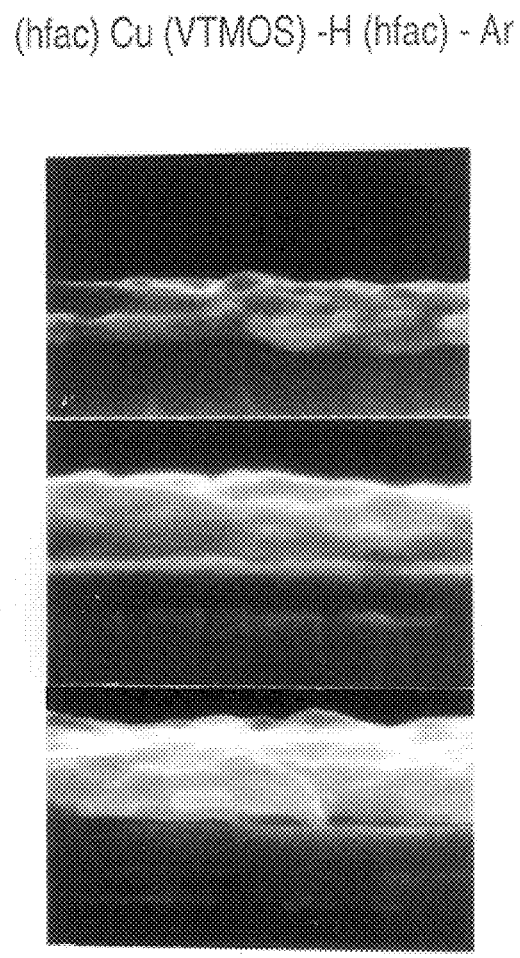
165°C
175°C
200°C
250°C
300°C

FIG. 5A
(hfac) Cu (VTMOS) - Ar
|— 1.5 μm —|
FIG. 5B
(hfac) Cu (VTMOS) -H (hfac) - Ar
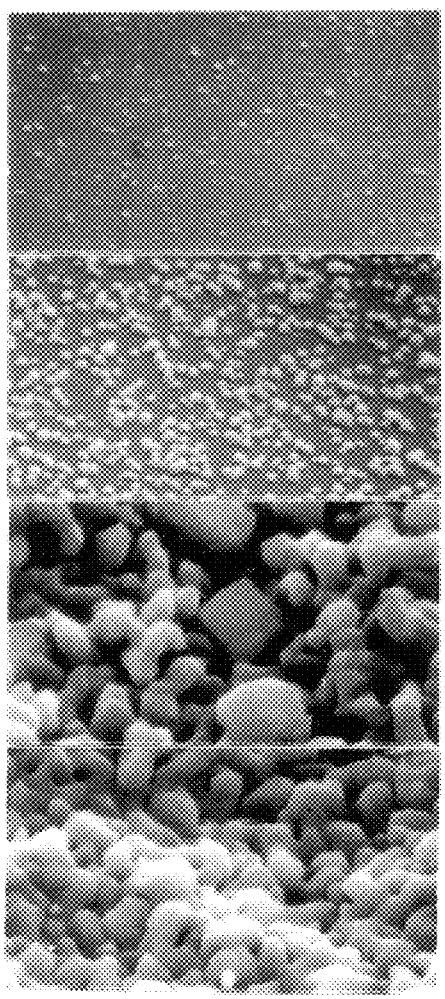
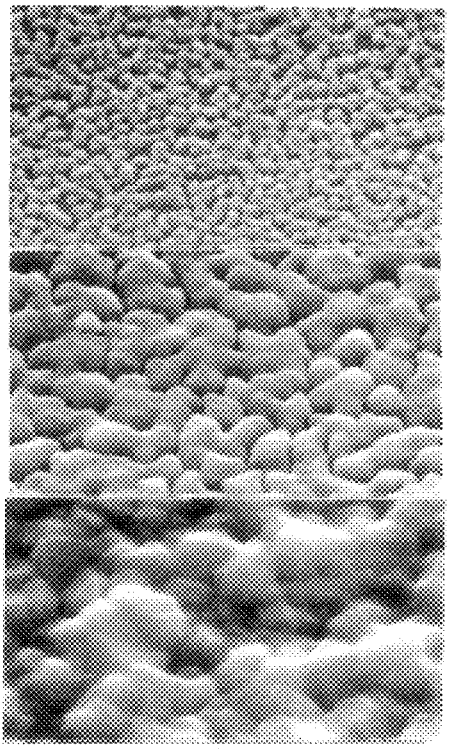
175°C
200°C
225°C →
← 250°C
300°C

FIG. 6A
(hfac) Cu (VTMOS) - Ar
FIG. 6B
(hfac) Cu (VTMOS) -H (hfac) - Ar
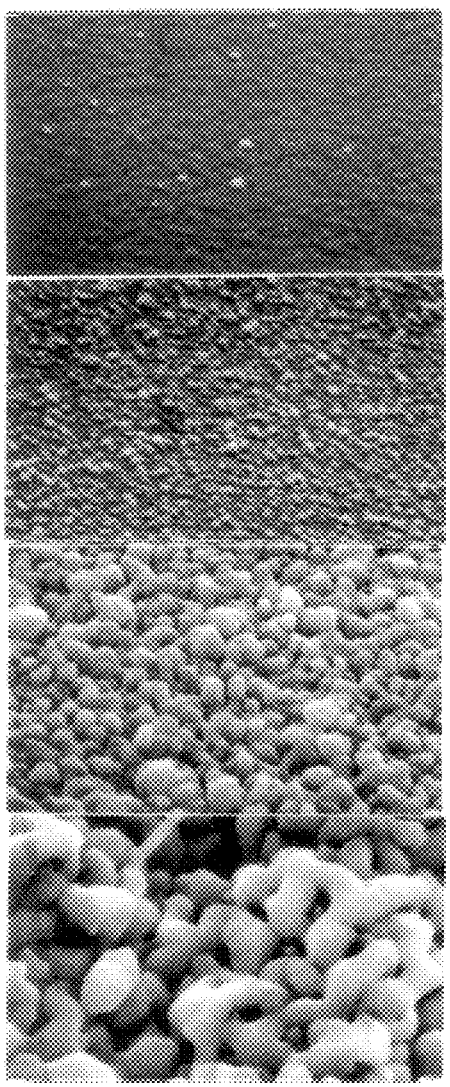
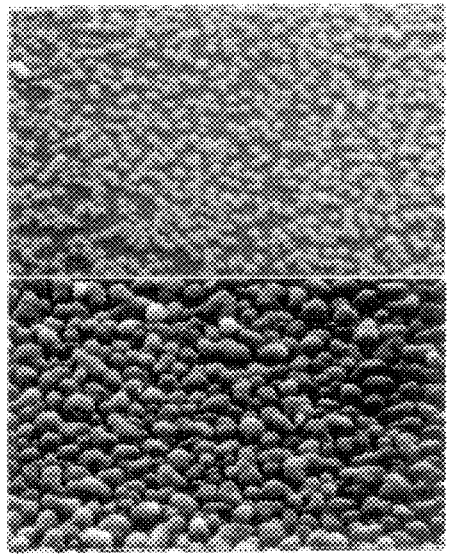

METHOD FOR FORMING COPPER FILM USING CHEMICAL VAPOR DEPOSITION

BACKGROUND OF THE INVENTION

1. Field of the Invention

The present invention relates to a chemical vapor deposition apparatus and a copper film formation method using the same, and in particular, to an improved chemical vapor deposition apparatus and a copper film formation method using the same which are capable of forming a copper film having excellent physical and chemical characteristics with a high deposition rate, controlling a selective deposition and blanket deposition characteristic and obtaining an embedding characteristic of a copper film for thereby implementing a reliable copper film deposition.

2. Description of the Conventional Art

Copper having a low electrical resistivity and high EM(electromigration) durability is increasingly used as a material for an aluminum semiconductor wiring in order to overcome signal transfer delay and EM problems which occur as the semiconductor device is highly-integrated, the wiring width is decreased, and the wiring length is increased. In particular, a CVD (Chemical Vapor Deposition) method is used for obtaining a desired characteristic of a copper film. In the CVD method, as a copper source for forming a thin film, Cu(I) and Cu(II) organic metallic compounds of β-diketonate group, which are represented as (hfac)Cu(VTMS)[1,1,1,5,5,5-hexafluoro-2,4-pentanedionato(vinyltrimethylsilane) copper(I): $C_{10}H_{13}O_2CuF_6Si$] and $Cu(hfac)_2[bis(1,1,1,5,5,5-hexafluoro-2,4-pentanedionato)copper(II):C_{10}H_2O_4CuF_{12}]$, are used. When depositing a thin film using a stable solid $Cu(hfac)_2$ as a copper source, a low growth rate and a high electrical resistivity value are obtained. In the case of liquid (hfac)Cu(VTMS), the deposition characteristic is better than that of $Cu(hfac)_2$ but it is thermally unstable, so that the material is deteriorated during its storage and evaporation. In addition, since the copper source is supplied into the reaction chamber based on a bubbler method which is directly heating the bubbler having a copper source therein, a copper source temperature and vapor pressure are fluctuated, so that the vaporized amount of a copper source is inaccurately controlled. Therefore, it is impossible to obtain a uniform deposition of the copper film.

In order to overcome the above-described problems, a new material having a stable thermal characteristic, high vapor pressure and excellent deposition characteristic is needed, so that the amount of a copper source which is supplied for a deposition operation is accurately controlled.

For adapting copper chemical vapor deposition to a multilevel wiring structure for a semiconductor device, a predetermined deposition method is needed, which has a predetermined film characteristic such as an electrical resistivity, a preferred orientation, etc., a control characteristic such as a selective and a blanket depositions for a wafer formed of a diffusion barrier, an adhesion layer, a passivation layer for preventing oxidation and contamination, etc., and a good deposition characteristic for a contact and via holes and a trench structure based on a high aspect ratio pattern.

In the conventional chemical vapor deposition method, a copper film is deposited in a temperature range of about 130° C. through 450° C. In such temperature range, it is very difficult to fabricate a copper film having a low electrical resistivity based on a high deposition rate. Namely, at a high temperature at which a high deposition rate is obtained, a connectivity between copper grains in thin films is deteriorated dependent on a grain growth, so that an electrical resistivity is increased, and at a lower deposition temperature, a lower resistivity copper film may be formed but a deposition rate is decreased. Therefore, it is difficult to actually adapt the above-described deposition method.

In the case of the copper film, the EM durability of the wiring portion is mainly determined by a preferred orientation of Cu(111)/Cu(200). Since the conventional chemical vapor deposition is a thermally activated process, it is difficult to obtain a copper film of a high <111> preferred orientation. In the deposition operation, since an electron transfer plays a role for adsorption and desorption of a copper source and its intermediate products on the surface of the wafer, a deposition characteristic of a thin film such as an electrical resistivity, so that a morphology of a thin film, a deposition rate, etc. are affected by the substrate type. Therefore, since the selective deposition or blanket deposition characteristic of a copper thin film are determined based on the material of the wafer, the temperature, the pressure, etc. Therefore, it is very difficult to set an optimum deposition condition for forming a semiconductor wiring structure because a selective deposition or a blanket deposition characteristic in accordance with a fabrication condition such as a material of the wafer, a temperature and a pressure. In addition, as the size of the semiconductor pattern is decreased, a copper film of small size grains is required for filling of the small size pattern. However, if n the conventional art, since the grain size of the thin film is large and the film structure is rough, the formation characteristic may be deteriorated, so that a predetermined problem such as a poor step coverage and microvoid formation may occur in the fine pattern filled with the copper film.

Therefore, a reliable copper film formation method is needed, which is capable of overcoming film uniformity and repeatability problems related to copper deposition due to deterioration and improper delivery of a copper precursor, depositing a copper film having a lower electrical resistivity and a <111> preferred orientation with a high deposition rate at a lower deposition temperature, controlling a selective and blanket depositions characteristic based on a substrate material, and obtaining a good filling characteristic and a superior step coverage for forming a copper film on a semiconductor fine pattern having a high aspect ratio.

SUMMARY OF THE INVENTION

Accordingly, it is an object of the present invention to provide a chemical vapor deposition apparatus and a copper film formation method using the same which overcome the aforementioned problems encountered in the conventional art.

It is another object of the present invention to provide a chemical vapor deposition apparatus and a copper film formation method using the same which are capable of forming a copper film having a good physical and chemical characteristic with a high deposition rate, controlling a selective deposition and blanket deposition characteristic and obtaining an embedding characteristic of a copper thin film for thereby implementing a reliable copper thin film deposition.

In order to achieve the above objects, there is provided a chemical vapor deposition apparatus which includes a process gas delivery unit including a first storing unit using a liquid copper precursor, a delivery unit for transferring a liquid copper source in the first storing unit to an evaporator, and an evaporator for vaporizing the liquid copper source transferred from the delivery unit and supplying a process gas; and a reaction chamber for receiving the process gas from the process gas delivery unit and deposition a predetermined thin film on a wafer mounted therein.

In order to achieve the above objects, there is provided a copper film formation method using a chemical vapor deposition apparatus which includes the step of introducing a copper precursor of (hfac)Cu(VTMOS)[1,1,1,5,5,5-hexafluoro-2,4-pentanedionato(vinyltrimethoxysilane)copper(I):$C_{10}H_{13}O_5CuF_6Si$] into the reaction chamber.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 4A and 4B are views illustrating a cross-sectional microstructure based on a substrate temperature and a deposition method for a copper film deposited on a TiN substrate by a chemical vapor deposition method according to the present invention;

FIGS. 5A and 5B are views illustrating a surface morphology based on a substrate temperature and a deposition method for a copper film deposited on a p-<100> Si wafer by a chemical vapor deposition method according to the present invention;

FIGS. 6A and 6B are views illustrating a surface morphology based on a substrate temperature and a deposition method for a copper film deposited on a $Si_3N_4$ substrate by a chemical vapor deposition method according to the present invention.

DETAILED DESCRIPTION OF THE INVENTION

The chemical vapor deposition apparatus and a copper thin film formation method using the same according to the present invention will be explained with reference to FIGS. 1 through 7.

Figure 1:
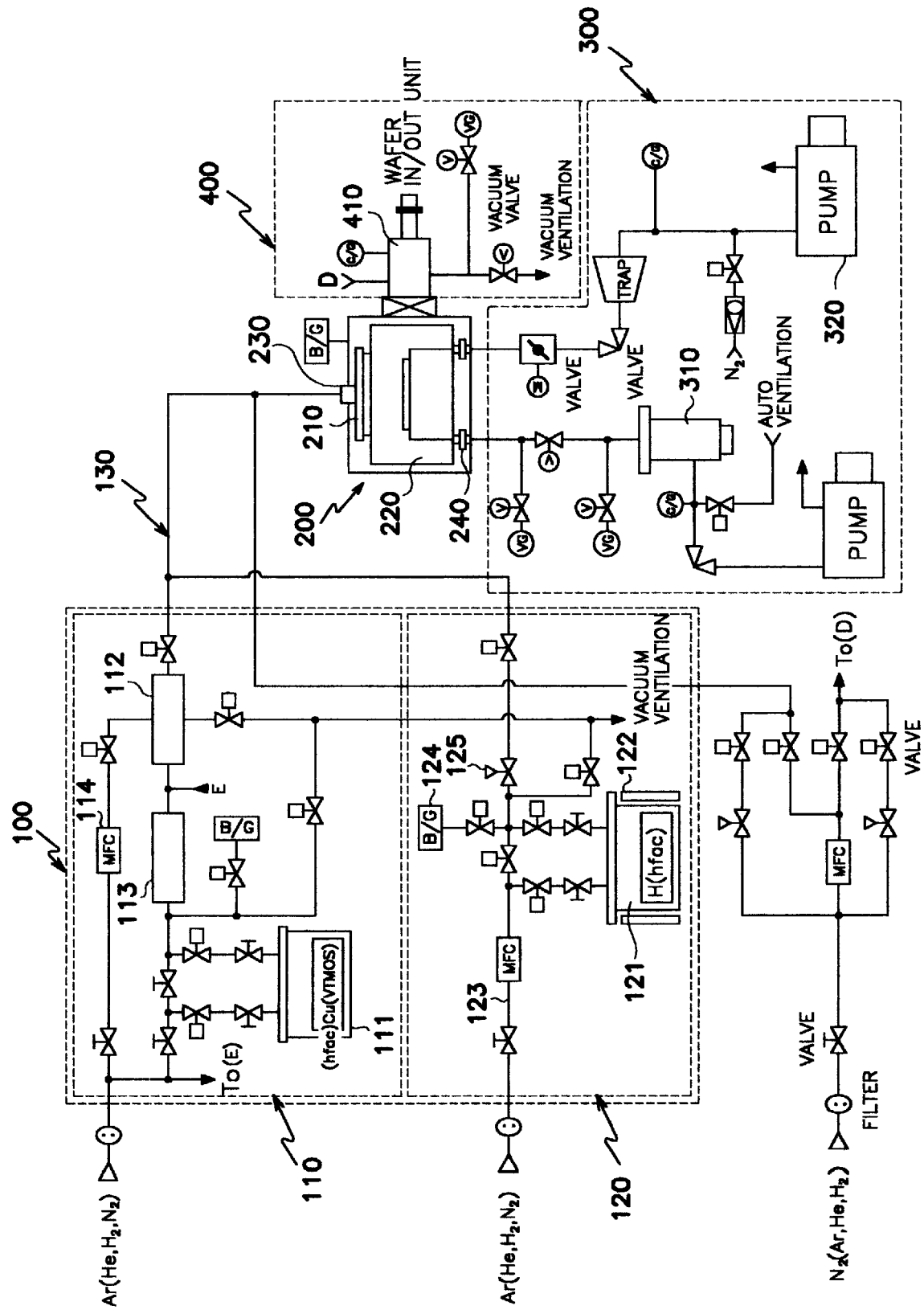
FIG. 1 is a view illustrating a chemical vapor deposition apparatus according to the present invention.

As shown in FIG. 1, the chemical vapor deposition apparatus according to the present invention includes a process gas delivery unit 100, a reaction chamber 200, a vacuum pumping unit 300, and a wafer loading/unloading unit 400. The process gas delivery unit 100 includes first and second process gas delivery units 110 and 120.

The first process gas delivery unit 110 includes a copper source container 111, an evaporator 112, and a micropump 113 for controlling the amount of a copper source supplied from the copper source container 111 to the evaporator 112. Process gas such as Ar, He, $H_2$, $N_2$, etc. is introduced into the evaporator 112 through a mass flow controller (MFC) 114. The liquid copper source in the container 111 which remains at a room temperature is pressurized, and then the amount of the copper source is controlled by the micropump 113. The copper source is vaporized by the evaporator 112 and then flows into the reaction chamber 200. The copper source container 111 is maintained at a room temperature, so that it is possible to prevent a deterioration of the copper source and to control the copper source to remain as a liquid. Therefore, by employing the first process gas delivery unit 110, in the bubbler supply method, a condensation and depositing problem in a supply line and an occurrence of particles are prevented. In addition, it is possible to prevent a problem that a copper source is not accurately supplied due to the fluctuation of the bubbler temperature and variation of a vapor pressure of the copper source.

Therefore, (hfac)Cu(VTMOS) as a copper source is supplied to the reaction chamber 200 through the first process gas delivery unit 110, so that it is possible to implement a uniform deposition in chemical vapor deposition and to decrease a maintenance time of chemical vapor deposition apparatus.

In addition, in the present invention, H(hfac)[1,1,1,5,5,5-hexafluoro-2,4-pentanedione:$C_5H_2O_2F_6$] of 99.9% purity is combined with the copper source and is provided into the reaction chamber 200 for obtaining an optimum deposition characteristic by controlling adsorption and desorption behavior of (hfac) Cu (VTMOS) in the initial stage of a film growth, and the reaction mechanism of copper deposition. Namely, H(hfac) in the bubbler 121 of the second process gas delivery unit 120 is heated by a heater 122. The amount of H(hfac) is controlled by the bubbler temperature and the flow rate of a carrier gas 123 and is bubbled by a carrier gas and then flows into the reaction chamber 200. In the conventional art, the deposition rate was increased using a predetermined reaction gas mixture such as Cu(I) (hfac)Cu (VTMS) and $H_2$. However, in the case of Cu(I), since the substrate temperature is 130° C. through 300° C. which are relatively low. Most of dissociated hydrogen species adsorbed to the substrate surface is immediately desorbed therefrom, so that the deposition rate is not increased. In the present invention, H(hfac) is well adsorbed to the substrate surface even at a lower temperature in the form of $H^+$ and (hfac)$^-$ for thereby varying the growth mode of the copper film.

The second process gas delivery unit 120 may be substituted with the same element as the first process gas delivery unit 110 for supplying H(hfac) into the reaction chamber 200. Namely, liquid H(hfac) flows to the evaporator for vaporize the same and then flows into the reaction chamber 200. Preferably, (hfac)Cu(VTMOS) and H(hfac) may be combined and then supplied into the reaction chamber through one gas delivery unit.

The reaction chamber 200 includes a showerhead type gas distribution unit 210, a wafer susceptor (not shown) on which a wafer is placed, a wafer heater 220, a process gas inlet 230, a gas exhaust 240, etc. The reaction chamber 200 is formed in a cylindrical structure of a single-wafer warmwall type which uses a wafer as a substrate. A showerhead type gas distribution unit 210 is installed above the reaction chamber 200 for uniformly supplying a process gas over the wafer. The inner wall of the reaction chamber 200 and the gas distribution unit 210 are heated by cartridge type heaters, so that a condensation of the copper source is prevented. The wafer is placed on the susceptor and is heated by the wafer heater 220.

The reaction chamber 200 is connected with the vacuum pumping unit 300, so that a predetermined vacuum degree is maintained by the turbo molecular pump 310 in the idling mode of the reaction chamber 200. When the deposition is actually performed, a ventilation is done by the mechanical pump 320. The process gas which flows into the reaction chamber 200 is processed by a thermal energy for thereby depositing a copper film on the surface of the wafer. Thereafter, the process gas is exhausted through the gas exhaust 240.

In addition, the reaction chamber 200 is connected with a wafer loading/unloading unit 400. The wafer loading/unloading unit 400 is provided with a loadlock chamber 410 or a cluster platform (not shown) in order for the reaction chamber 200 not to be exposed to the atmospheric environment during a loading and unloading operation of the wafer.

The amount of a purge gas and a carrier gas/diluting gas such as Ar, He, $H_2$, $N_2$, etc. is controlled by the mass flow controller and then is supplied from the process gas delivery unit 100 to the reaction chamber 200 and the loadlock chamber 410 in a single form or a combined form. Ar, He, $H_2$, $N_2$, etc. flown into the first and second process gas delivery units 110 and 120 are used as a carrier gas/diluting gas of (hfac)Cu(VTMOS) and H(hfac) In addition, the final gas delivery line 130 which is capable of preventing a condensation of the liquid compound during a gas delivery is heated to a predetermined temperature. Therefore, in the present invention, the copper film is deposited based on a chemical vapor deposition using the (hfac)Cu(VTMOS)-Ar (He, $H_2$, $N_2$) system of the (hfac)Cu(VTMOS)-H(hfac)-Ar (He, $H_2$, $N_2$) system.

Next, the copper film formation method using a chemical vapor deposition apparatus according to the present invention will be explained with reference to the accompanying drawings.

In the present invention, as a copper source supplied into the reaction chamber 200 by the first process gas delivery unit 110, a chartreuse liquid (hfac)Cu(VTMOS) with a purity of 99.99% is used. The copper-ligand bond of the copper source is reinforced by $Si(CH_3O)_3$ among a VTMOS ligand, namely, a methoxy group. The copper source which has a vapor pressure of about 0.28 Torr at 60° C., is thermally stable up to about 65° C.

The following table 1 illustrates process conditions for a copper chemical vapor deposition according to the present invention.

TABLE 1

| Parameters | Process Conditions |
| --- | --- |
| Substrate type | TiN: 1000Å<br>(Reactive sputtering or<br>rapid thermal conversion)<br>p-<100> Si (silicon wafer)<br>$Si_3N_4$:8300Å (low pressure<br>chemical vapor deposition) |

TABLE 1-continued

| Parameters | Process Conditions |
| --- | --- |
| Pressure of reaction chamber | 0.05 ~ 50 Torr |
| Temp. of substrate | 130 ~ 300° C. |
| Amount of (hfac) Cu (VTMOS) | 0.05 ~ 1.0 ccm (liquid) |
| Temp. of evaporator | 50 ~ 70° C. |
| Amount of carrier gas for<br>(hfac) Cu (VTMOS) | 50 ~ 500 sccm (Ar, $H_2$, He, $N_2$) |
| Temp. of H (hfac) bubbler | room Temp. ~ 70° C. |
| Amount of carrier gas for<br>H (hfac) | 0 ~ 100 sccm (Ar, $H_2$, He, $N_2$) |
| Temp. of final gas line | 60 ~ 80° C. |

In the present invention, the thickness, micro structure, crystal line structure and electrical resistivity of the copper film formed according to the present invention are measured by the scanning electron microscopy (SEM), X-ray diffraction analysis (XRD), and 4-point probe.

Figure 2:
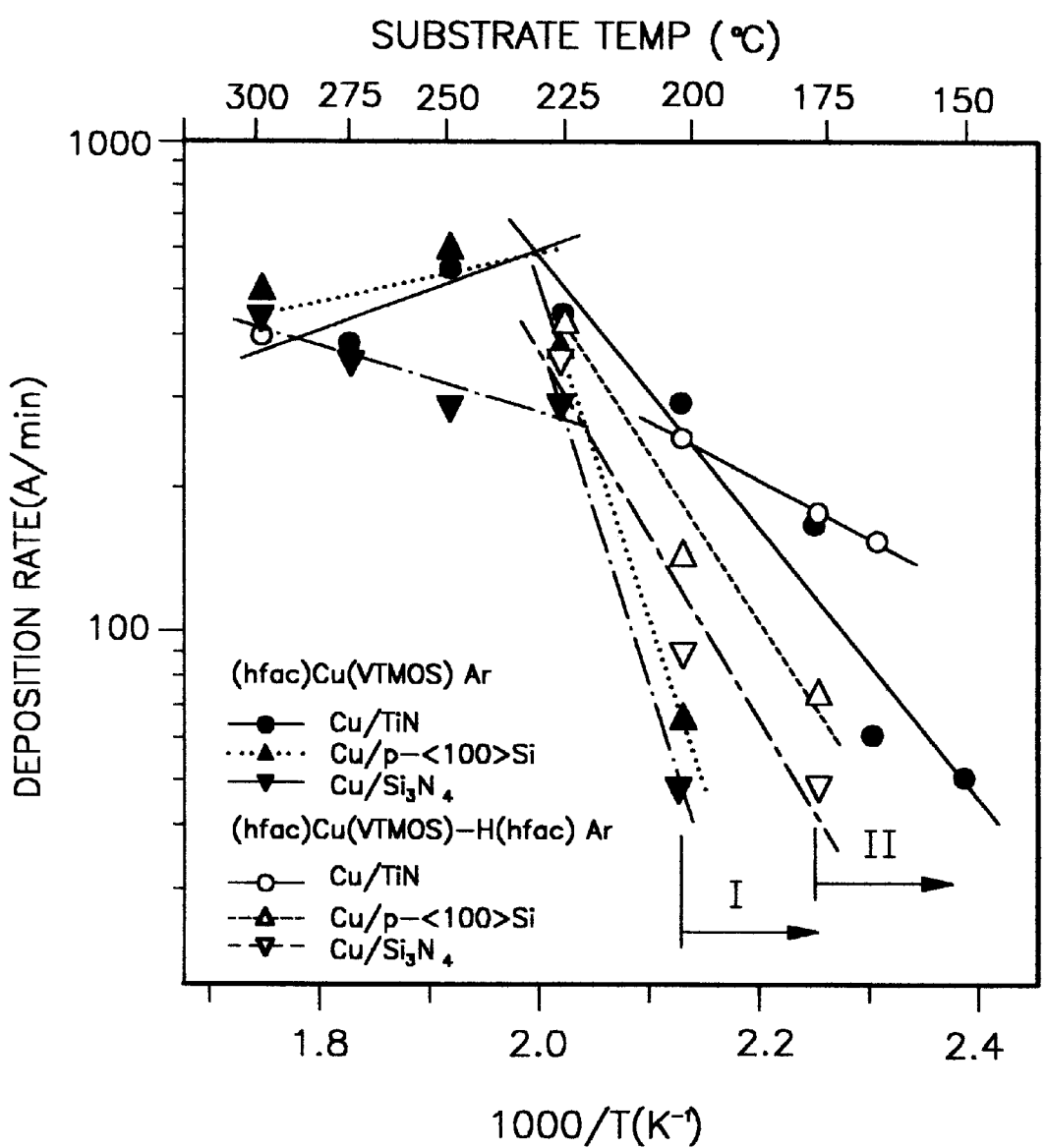
FIG. 2 is a view illustrating a graph explaining an interrelationship between a deposition rate of a copper film formed by a chemical vapor deposition apparatus, a substrate temperature, a substrate type, and a deposition method according to the present invention.
Figure 3A:
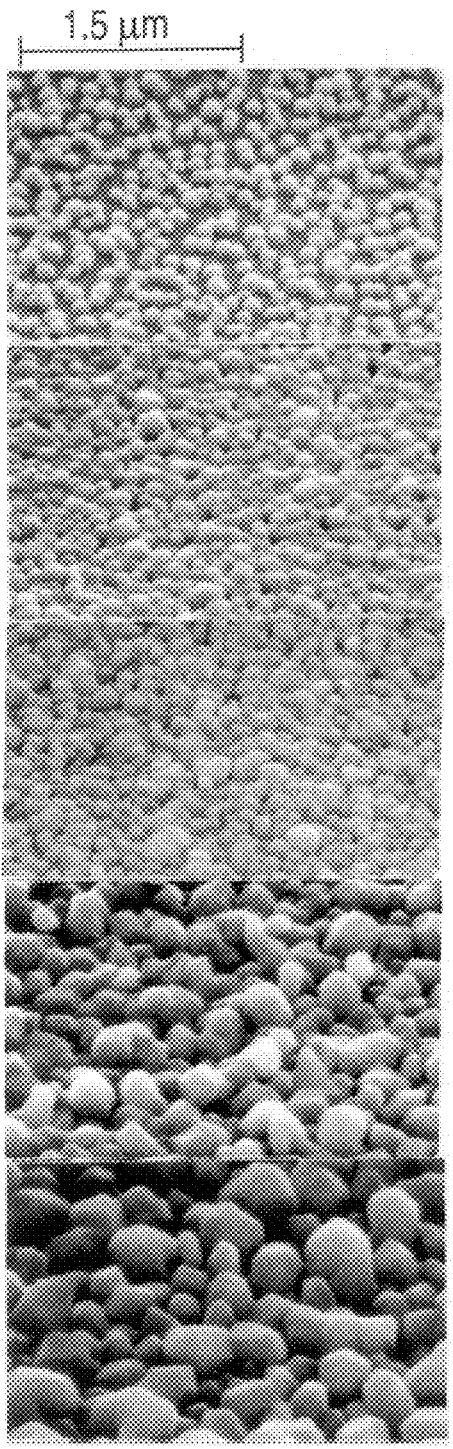
FIGS. 3A and 3B are views illustrating a surface morphology based on a substrate temperature and a deposition method for a copper film deposited on a TiN substrate by a chemical vapor deposition method according to the present invention.
Figure 3B:
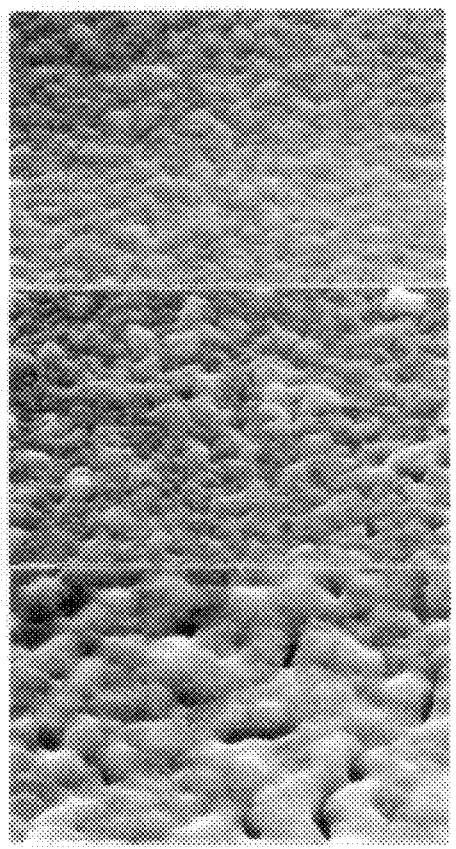

First, the interrelationship between the deposition rate of a copper film, a substrate temperature, a substrate material and a deposition method according to the present invention is analyzed. A 5-inch wafer was used as a substrate. In the warm-wall type copper chemical vapor deposition apparatus, the pressure of the reaction chamber 200, the amount of (hfac)Cu(VTMOS) as a copper source and Ar as a carrier gas, and the temperature of an evaporator were 0.6 Torr, 0.2 sccm, 200 sccm and 60° C., respectively. H(hfac) in the bubbler 121 was flown into the reaction chamber in the vapor phase. FIG. 2 is an Arrhenius table illustrating a deposition rate as a function of the substrate temperature for a copper film deposited on a TiN, a p-<100> Si, $Si_3N_4$ substrates for 10 minutes.

The pressure in the H(hfac) bubbler 121 was fixed to 7.3 Torr a Baratron vacuum gauge 124 and a needle valve 125. At this time, the substrate temperature was within a range of 130° C. through 300° C. for the (hfac)Cu(VTMOS)-Ar system and the (hfac)Cu(VTMOS)-H(hfac)-Ar system, the temperature was maintained within a range of 165° C. through 225° C. The above-described range was determined as the range in which the deposition rate of the (hfac)Cu (VTMOS-Ar) system was defined as a surface-reaction controlled region.

As shown in FIG. 2, the deposition rate of copper on the TiN substrate was significantly increased below a temperature of 175° C. by the addition of H(hfac). In the case that the substrate temperature was 165° C., the deposition rate was about 150 Å/min which was two times as high as the process in which H(hfac) was not used. In addition, at a temperature of 200° C., the deposition rate was decreased compared to when using the (hfac)Cu(VTMOS)-Ar system. Namely, as a result of the comparison of the film microstructure shown in FIGS. 3A through 6B, in the case of the (hfac)Cu(VTOMS)-Ar system, the surface morphology of the copper deposit was a columnar structure with a rough surface. It means that copper grew into individual particulate. When adding H(hfac), a lateral connectivity between crystal grains was greatly improved, and a smooth thin film was obtained. This explains the predetermined thickness difference in both deposition systems. The difference of the growth rate was increased as the substrate temperature become lowered based on whether H(hfac) was added or not. At the lower substrate temperature, H(hfac) directly affected the nucleation density of copper and a surface reaction mechanism in the initial stage of a film growth.

When depositing a copper film on a p-<100> Si and a $Si_3N_5$ substrate, respectively, the deposition rate was significantly increased in the lower temperature region below 200° C. due to the addition of H(hfac).

In addition, the deposition reaction was implemented even at 175° C. at which the reaction was not generally performed in the case of the (hfac)Cu(VTMOS)-Ar system. Therefore, it was judged that the effect of the H(hfac) addition was predominant in the lower temperature of the surface-reaction controlled region irrespective of the substrate type. In addition, the deposition rate in the case of the H(hfac) addition was increased based on the sequence of $Si_3N_4<Si<TiN$ with respect to the identical substrate temperature below 200° C. Therefore, it was judged that the difference in the deposition rate based on the substrate type was obtained for thereby implementing a selective deposition.

The upper limit temperature was decreased from <200° C. (region I) for the (hfac) Cu (VTMOS)-H(hfac)-Ar system to <175° C. (region II) for the (hfac)Cu(VTMOS)-Ar system for implementing a copper selective deposition onto a TiN substrate with respect to Si and $Si_3N_4$ by an activation surface reaction at a low temperature.

The following table 2 illustrates an interrelationship between an apparent activation energy value of a CVD reaction, a substrate type, and a deposition method based on a chemical vapor deposition according to the present invention. The above-described table 2 is obtained based on the temperature of a surface-reaction controlled region using the Arrhenius table of FIG. 2.

TABLE 2

| | Deposition method Activation energy (kcal/mol) | |
|---|---|---|
| substrate type | (hfac)Cu(VTMOS)-Ar | (hfac)Cu(VTMOS)-H(hfac)-Ar |
| TiN | 12.7 | 5.8 |
| p-<100> Si | 31.9 | 16.4 |
| $Si_3N_4$ | 32.5 | 17.1 |

A predetermined difference occurred in the nucleation density of a copper at an initial stage of the deposition based on the difference of an electron catalytic activity on the surface of a conducting and an insulating substrate. Therefore, the activation energy value of the deposition on the TiN substrate was below one half of that of the deposition on the Si and $Si_3N_4$. If the disproportionation reaction is initiated from (hfac) Cu (VTMOS), electrons supplied to the $Cu^{+1}$(hfac) adspecies derived from the cu (hfac)-VTMOS bond should be required to produce the copper film. At this time, the capability of electron transfer to the adspecies is proportional to the electrical conductivity of the substrate.

Therefore, in the initial stage of a film growth, the TIN substrate plays a more active role as free electron donors to the adspecies compared to p-<100> Si and $Si_3N_4$, so that the deposition rate on TiN was higher than that or p-<100> Si and $Si_3N_4$ at low temperature region. When adding H(hfac), the activation energy of the copper deposition was in a range of 5.8 kcal/mol through 17.1 kcal/mol. This value was about one half compared to the range of 12.7 kcal/mol through 32.5 kcal/mol in the case of the (hfac)Cu(VTMOS)-Ar system. The activation energy was more easily decreased by the adsorption of H(hfac) on the substrate surface as $H^+$ and (hfac)$^-$ for thereby changing the reaction step and expediting the deposition reaction. In addition, since it was important to increase the deposition rate at a lower temperature, the process window for the selective deposition depending upon the substrate type was reduced by the addition of H(hfac) but the range of the process temperature for the blanket deposition was expanded.

FIGS. 3A through 6B illustrate SEM micrographs of a surface morphology of a copper film and a cross-sectional micro-structure of the same based on a substrate temperature, substrate type and deposition method of a copper thin film fabricated based on the process condition of FIG. 2 according to the present invention.

FIGS. 3A through 4B are SEM micrographs illustrating a surface morphology and cross-sectional view of a copper film deposited on a TiN substrate. In the case of the (hfac)Cu(VTMOS)-Ar system (reference character A in the drawings), some copper crystallites coalesced on the surface of the TiN substrate at a low temperature. As the substrate temperature increased, the copper film was grown based on a three-dimensional island growth in the sequence of nucleation→formation of columnar structure→grain coarsening. Therefore, the connectivity between resultant grains of the deposit film was deteriorated, and many microvoids may exist within the thin film, and the substrate of the film reveals a roughed structure.

In the case of the addition of H(hfac) (reference characters B in the drawings), the surface morphology and cross-sectional micro-structure of the copper film were significantly changed. Even at a low temperature of 165° C., a continuous film was implemented. As the substrate temperature increased, only the crystal grains were grown with maintaining the microstructure, so that some voids appeared within the film. In addition, the lateral connectivity between neighboring grains was greatly improved compared to that of the (hfac)Cu(VTMOS)-Ar system, so that the microvoid density and the surface roughness of the copper film were decreased and improved. As a result, the nucleation density of copper was increased by adding H(hfac). Namely, the crystallites were grown in very small size. In particular, the copper film deposited at 165° C. had a dense and smooth microstructure.

FIGS. 5A and 6B are SEM micrographs illustrating a surface morphology of a copper layer formed on a p-<100> Si and a $Si_3N_4$ substrate. In the case of the (hfac)Cu(VTMOS)-Ar system (reference character A in the drawings), the selective deposition characteristic was significantly obtained, and a deposition reaction was difficult to take place at a temperature below 175° C. for two substrates. In this case, a nucleation was actively formed at over 200° C. The incubation time over which the copper nuclei was generated on Si and $Si_3N_4$ at the initial time of the deposition was lengthy compared to when the electron catalytic reaction was performed on the TiN substrate. In addition, the thin film deposited on the Si wafer at a temperature of 250° C. had a wide distribution in the grain size compared to the copper film formed on TiN based on the (hfac)Cu(VTMOS)-Ar system. The copper deposition onto TiN was performed based on a metal-metal system having a small difference in the surface free energy between copper and TiN. The deposition onto p-<100> Si and $Si_3N_4$ based on a metal-insulator (semiconductor) system having a large difference in the surface free energy between copper and the substrate, directly affected the surface roughness of the deposit film. In addition, the copper film on p-<100> Si and $Si_3N_4$ based on the (hfac)Cu(VTMOS)-H(hfac)-Ar- system (reference character B in the drawings) had a significant surface modification compared to the deposition based on the (hfac)Cu(VTMOS)-Ar system. On the Si wafer, the crystallites coalesced at a deposition temperature of 175° C., and as the reaction temperature was increased, the crystallites was grown and the grain growth was implemented in a lateral direction. In particular, at 225° C., a thin film which does not has microvoids was formed. On $Si_3N_4$, the similar result was obtained, and the crystallite density was lower compared to on p-<100> Si at 175° C. At 200° C., a crystal was grown. However, the size of the same was smaller than that on the Si wafer, and the interconnection between neighboring grains was not obtained in the lateral direction. When introducing H(hfac), on the deposition film on the Si and $Si_3N_4$ (reference character B in the drawings), the nucleation was more easily implemented in the lower temperature compared to the (hfac)Cu(VTMOS)-Ar system (reference character A in the drawings), so that the process window on the blanket deposition was expanded. In particular, in the case of the Si wafer, it was possible to obtain a copper film having a uniform distribution of grain sizes based on a better lateral connectivity between neighboring grains at a temperature of 225° C. (in the case of $Si_3N_4$, the temperature is higher than 225° C.).

The following table 3 illustrates an interrelationship between a preferred orientation of a copper film, a substrate temperature, a substrate type and a deposition method according to the present invention.

TABLE 3

| Deposition Temp (° C.) | Deposition method XRD peak intensity ratio**: [(hfac)Cu(VTMOS)-Ar]/[(hfac)Cu(VTMOS)-H(hfac)-Ar] substrate | |
|---|---|---|
| | TiN | p-<100>Si |
| 165 | —/5.17* | — |
| 175 | 5.04/14.87* | — |
| 200 | 3.21(5.38*)/7.14* | —/2.96 |
| 225 | — | 0.75/2.59 |
| 250 | 2.78/— | — |
| 300 | 2.78(4.08*)/— | 2.53/— |

*: Copper film formed on TiN substrate based on rapid thermal conversion
**: $I_{Cu(111)}/I_{Cu(200)}$ As a result of the XRD, the preferred orientation was obtained based on the intensity ratio of the Cu (111) peak with respect to Cu(200) peak of copper. In the case of a powdered standard sample of copper, the preferred orientation was about 2.17. As a result of the variation of the deposition temperature of the (hfac)Cu(VTMOS)-Ar system, in the deposit film on TiN, the <111> preferred orientation was increased due to the TiN(111) orientation of the substrate in a range of 175° C. through 200° C. and then was decreased. In the case of the copper film on the p-<100> Si wafer, the deposit obtained at 225° C. had a (200) preferred orientation due to a lower deposition rate on the Si wafer, and as the deposition temperature was increased, the deposition rate was recovered for thereby obtaining a <111> preferred orientation. In addition, when H(hfac) was introduced into the reaction chamber, the copper film deposited on TiN at 175° C. and on Si at 200° C. had a large <111> preferred orientation of 14.87 and 2.96, respectively.

In addition, the durability with respect to the EM of a semiconductor wiring formed of a face-centered-cubic structure metallic film was mainly determined by the grain size distribution and the preferred orientation of the wiring portion. The copper film obtained by the H(hfac) addition had a uniform grain size distribution and a dense microstructure compared to that by the (hfac)Cu(VTMOS)-Ar system as a result of the resultant material shown in FIGS. 3A through 6B. In addition, as shown in the table 3, the <111> preferred orientation of the copper film was also enhanced. Therefore, it was possible to obtain a reliable copper wiring having an extended life span by introducing H(hfac) during the copper deposition.

Figure 7:
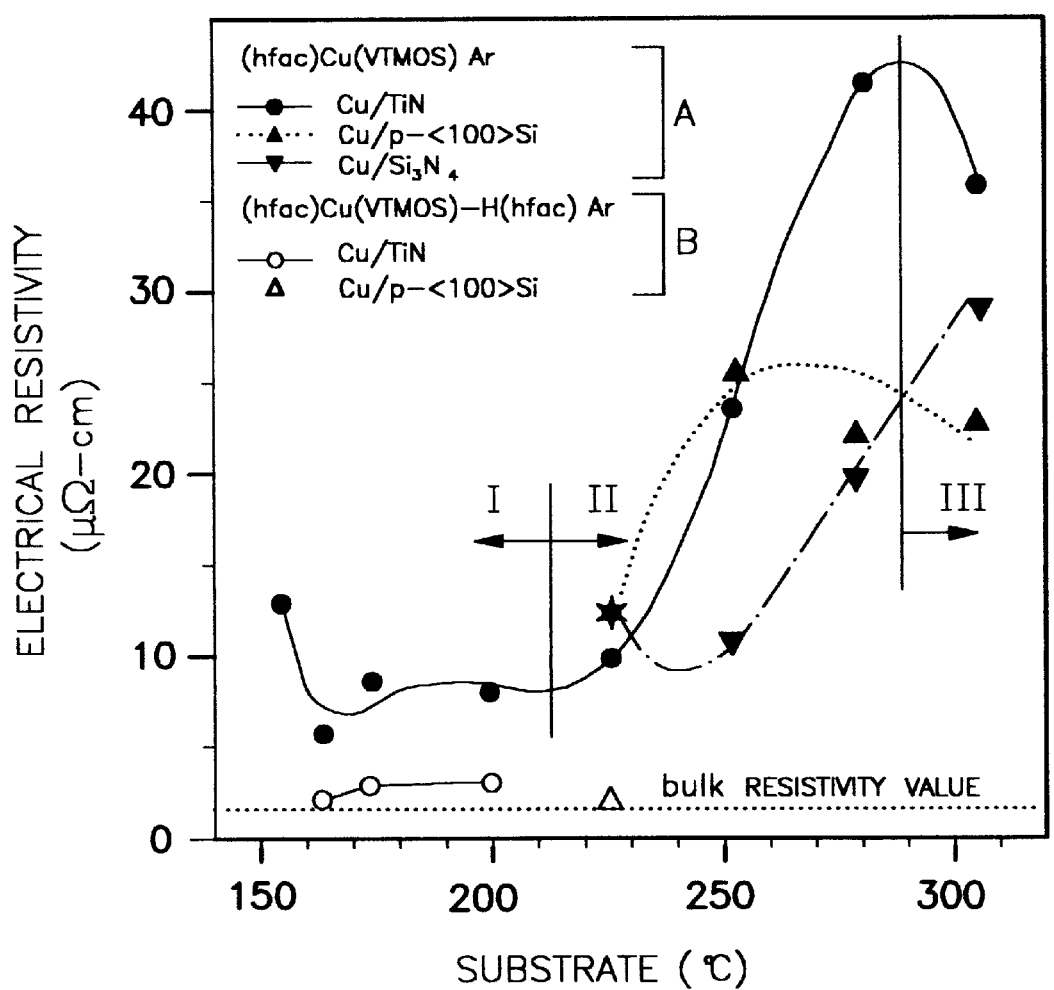
FIG. 7 is a graph illustrating an interrelationship between an electrical resistivity of a copper film and a substrate temperature, a substrate type, and a deposition method according to the present invention.

FIG. 7 is a graph illustrating an interrelationship between an electrical resistivity of a copper film and a substrate temperature, a substrate type, and a deposition method according to the present invention. As shown therein, in the case of the (hfac)Cu(VTMOS)-Ar system (reference character A in the drawings), the deposition time was 20 minutes at a temperature of 155° C. through 165° C. and 10 minutes at a temperature exceeding 165° C. in order to minimize the dependency of the film thickness on an electrical resistivity. The copper film deposited on the TiN substrate had a low electrical resistivity when the substrate temperature is in a range from 165° C. to 200° C. Outside the above-described temperature range, the electrical resistivity was increased. Namely, the resistivity value was differently changed in the following three regions. Among the above-described regions, in the first region I, the resistivity value was decreased from 155° C. (1100 Å) and had a minimum value of 5.41 μΩ-cm at 165° C. (1500 Å) and then was slightly increased at 200° C., and in the second region, the resistivity value was rapidly increased up to 275° C. as the substrate temperature was increased, and in the third region, the resistivity value was decreased at 300° C.

In addition, the electrical resistivity of the copper film deposited on the Si and $Si_3N_4$ was directly affected by the deposition rate as shown in FIG. 2. Therefore, as the deposition rate was increased, the resistivity value was also increased. Therefore, it was recognized that the resistivity value was directly affected by the surface roughness of the thin film. In addition, in the case of the temperature of 275° C. and 300° C. at which a continuous copper film was formed on the entire surfaces of the substrate, even though there was not difference in a deposition rate based on the substrate type, it was possible to obtain a better resistivity values of the deposits on Si and $Si_3N_4$ compared to that on TiN for the reason that as the substrate temperature was increased, a thin film was formed on TiN, and a columnar structure, while the coalescence of the copper grains on Si and $Si_3N_4$ was developed. In the case of the (hfac)Cu(VTMOS)-H(hfac)-Ar system (reference character B in the drawings), a copper film was deposited for 10 minutes, in the surface-reaction controlled region in which a lower electrical resistivity was obtained using the (hfac)Cu(VTMOS)-Ar system. The copper film deposited under the condition that the substrate temperature was 165° C. through 200° on TiN, and the thickness was 1500 Å through 2410 Å, had an electrical resistivity value which was 2.43 μΩ-cm through 3.56 μΩ-cm, which was about one half the value obtained by the (hfac)Cu(VTMOS)-Ar process. The 4160-Å-thick copper layer deposited on a p-<100> Si wafer at 225° C. has an excellent resistivity characteristic of 2.37 μΩ-cm. Namely, in the case of the H(hfac) addition, as shown in FIGS. 3B, 4B, 5B and 6B, it was possible to enhance a connectivity in a lateral direction between copper grains by an activation of the surface reaction and a copper nucleation to reduce the microvoid density, to improve the surface roughness and to fabricate a uniform size for thereby significantly decreasing the electrical resistivity of the deposit compared to that of the film obtained by the (hfac)Cu(VTMOS)-Ar system. Therefore, it was possible to form a copper film having an excellent electrical resistivity at a lower substrate temperature using the (hafc)Cu(VTMOS)-H(hfac)-Ar system, and the electrical resistivity was 2.43 μΩ-cm for a 1500-Å-thick film, 2.39 $\mu\Omega$-cm for a 1920-Å-thick film, 1.89 $\mu\Omega$-cm for a 3500 Å-thick-film, so that as the film thickness was increased, the electrical resistivity was decreased for thereby obtaining a predetermined value similar with a bulk value of copper.

As described above, in the present invention, it is possible to implement a reliable method of copper chemical vapor method by introducing (hfac)Cu(VTMOS) as a copper source, a carrier gas and H(hfac) into a reaction chamber, which process gases are supplied based on a liquid injection method for forming a copper wiring film having a low electrical resistivity, EM durability and excellent chemical and physical characteristic by controlling a surface reaction on a substrate. The present invention has the following advantages compared to a conventional copper chemical vapor deposition.

First, the chemical bond between copper and the ligand in (hfac) Cu (VTMOS) reinforced by a methoxy [$Si(CH_3O)_3$] for thereby forming the (hfac)Cu(VTMOS) compound as a copper source having thermal stability. In addition, since the thermally stable (hfac)Cu(VTMOS) compound is used, it is possible to effectively prevent a deterioration of the copper source during a storage and evaporation.

Second, the amount of (hfac)Cu(VTMOS) contained in the container at room temperature is accurately controlled by the liquid injection method using a micropump in a liquid state and then is delivered to the portion near the reaction chamber of the chemical vapor deposition apparatus, and then is quickly vaporized by the evaporator. The vaporized copper source is introduced together with a carrier gas. Therefore, in the present invention, it is possible to prevent a deterioration of the copper source in the canister condensation and particle formation problems of the copper source on gas delivery lines due to a long time heating of the bubbler which typically occurs in the bubbler supply method of a Cu(I) copper source such as (hfac) Cu (VTMOS). Furthermore, it is possible to overcome the problem that the amount of a copper source is changed by the drift of the bubbler temperature and the variation of the vapor pressure of a copper source, so that a desired deposition, a film uniformity and a process repeatability of chemical vapor deposition are implemented for thereby decreasing the maintenance time of the deposition apparatus.

Third, it is possible to control the surface reaction of the copper source with the substrate and characteristic of the copper film by introducing H(hfac) together with (hfac)Cu (VTMOS) and a carrier gas into the reaction chamber of the chemical vapor deposition apparatus.

Fourth, it is possible to increase a deposition efficiency by expediting copper deposition under the condition of the surface-reaction controlled region using the (hfac)Cu (VTMOS)-H(hfac)-carrier gas system and forming a copper film based on a high deposition rate at a low substrate temperature.

Fifth, the copper nucleation is activated during a deposition reaction by the copper chemical vapor deposition using the (hfac)Cu(VTMOS)-H(hfac)-carrier gas system, and the dense film is formed, so that the connectivity in a lateral direction between crystal grains is improved. In addition, a uniform grain size is implemented. The surface roughness and the microvoid density are decreased, so that it is possible to form a copper film having a low electrical resistivity and a high <111> preferred orientation at low substrate temperature.

Sixth, an electron catalytic reaction between the copper source and the substrate is controlled by varying the concentration of H(hfac) based on the copper chemical vapor deposition using the (hfac)Cu(VTMOS)-H(hfac)-carrier gas system, so that the selective and blanket deposition of the copper film is controllable based on the substrate type and the deposition system.

Seventh, fine copper nuclei is densely formed at the initial stage of the film growth by the copper chemical vapor deposition using the (hfac)Cu(VTMOS)-H(hfac)-carrier gas system, so that grains with small size are grown, the surface mobility of the adspecies is increased, and the connectivity in a lateral direction between neighboring grains is enhanced. Even on the fine pattern of the semiconductor device having a high aspect ratio, it is possible to enhance a filling characteristic and a step coverage of the copper film.

Therefore, it is possible to form a copper film having an excellent physical and chemical characteristic based on a reliable fabrication method of a copper wiring using chemical vapor deposition.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for forming copper film using chemical vapor deposition comprising the steps of:

introducing 1,1,1,5,5,5-hexafluoro-2,4-pentanedionato (vinyltrimethoxysilane) copper(I) and 1,1,1,5,5,5-hexafluoro-2,4-pentanedione into a reaction chamber by using a process gas delivery means, the process gas delivery means including:

first storing means, a delivery means, an evaporator, second storing means, a thermal supply means, and a bubbling means, the first storing means maintaining the 1,1,1,5,5,5-hexafluoro-2,4-pentanedionato (vinyltrimethoxysilane) copper(I) at room temperature, the delivery means transferring the 1,1,1,5,5,5-hexafluoro-2,4-pentanedionato (vinyltrimethoxysilane) copper(I) in the first storing means to the evaporator and controlling the amount of the 1,1,1,5,5,5-hexafluoro-2,4-pentanedionato (vinyltrimethoxysilane) copper(I) flowing into the evaporator by a micropump, the evaporator vaporizing the 1,1,1,5,5,5-hexafluoro-2,4-pentanedionato (vinyltrimethoxysilane) copper(I) transferred from the delivery means and providing a port connected with a gas line for a first carrier gas, the second storing means receiving the 1,1,1,5,5,5-hexafluoro-2,4-pentanedione, the thermal supply means heating the 1,1,1,5,5,5-hexafluoro-2,4-pentanedione in the second storing means, the bubbling means bubbling the 1,1,1,5,5,5-hexafluoro-2,4-pentanedione by a second carrier gas, wherein the reaction chamber includes a substrate including a semiconducting, conducting or insulating film, a support member, a heater, a gas distribution unit, and a vacuum pumping port, the heater supplying thermal energy to the substrate mounted on the support member so as to induce copper chemical vapor deposition from said 1,1,1,5,5,5-hexafluoro-2,4-pentanedionato (vinyltrimethoxysilane) copper(I), and said 1,1,1,5, 5,5-hexafluoro-2,4-pentanedione, said deposited copper having a (111) preferred orientation, the gas distribution unit spraying process gases supplied from the process gas delivery means onto the substrate, and the vacuum pumping port is connected to a vacuum pressure providing means including a turbomolecular pump, a mechanical pump, a motorized throttle valve, and vacuum valves which control a pressure of the reaction chamber.

2. The method of claim 1, further comprising the step of introducing the first carrier gas and the second carrier gas in a single or combined form selected from the group consisting of Ar, He, $H_2$, and $N_2$ supplied through the evaporator and the bubbling means into the reaction chamber for controlling concentrations of the 1,1,1,5,5,5-hexafluoro-2,4-pentanedionato (vinyltrimethoxysilane) copper(I) and 1,1,1,5,5,5-hexafluoro-2,4-pentanedione and stabilizing their flows.

3. The method of claim 1, wherein a copper film is deposited onto the wafer or the substrate mounted on the support member in the reaction chamber by maintaining a temperature of the wafer or the substrate in a range of 130° C. to 300° C. with the heater for thermal decomposition of 1,1,1,5,5,5-hexafluoro-2,4-pentanedionato (vinyltrimethoxysilane) copper(I) and 1,1,1,5,5,5-hexafluoro-2,4-pentanedione supplied from the process gas delivery means to the reaction chamber.

4. The method of claim 1, wherein a pressure of the reaction chamber is maintained in a range of 0.05 Torr to 50 Torr by the vacuum pressure providing means including a turbomolecular pump, a mechanical pump, a motorized throttle valve, and vacuum valves.

* * * * *